(12) United States Patent
Soh et al.

(10) Patent No.: US 10,884,569 B2
(45) Date of Patent: Jan. 5, 2021

(54) TOUCH DISPLAY APPARATUS BY USING ELECTROMOTIVE FORCE AND METHOD FOR CONTROLLING THEREOF

(71) Applicant: SAMSUNG ELECTRONICS CO., LTD., Suwon-si (KR)

(72) Inventors: Byung-seok Soh, Yongin-si (KR); Jung-seop Kim, Seoul (KR); Chang-won Son, Seoul (KR); Ho-june Yoo, Seoul (KR); Kyung-hoon Lee, Seoul (KR)

(73) Assignee: SAMSUNG ELECTRONICS CO.. LTD., Suwon-si (KR)

( * ) Notice: Subject to any disclaimer, the term of this patent is extended or adjusted under 35 U.S.C. 154(b) by 91 days.

(21) Appl. No.: 15/791,694

(22) Filed: Oct. 24, 2017

(65) Prior Publication Data

US 2018/0129324 A1 May 10, 2018

(30) Foreign Application Priority Data

Nov. 9, 2016 (KR) ........................ 10-2016-0148512

(51) Int. Cl.

| | |
|---|---|
| *G06F 3/046* | (2006.01) |
| *H03K 17/96* | (2006.01) |
| *G06F 3/041* | (2006.01) |
| *G06F 3/0484* | (2013.01) |
| *G06F 3/0488* | (2013.01) |

(52) U.S. Cl.
CPC .............. *G06F 3/046* (2013.01); *G06F 3/041* (2013.01); *G06F 3/0418* (2013.01); *G06F 3/0484* (2013.01); *G06F 3/0488* (2013.01); *G06F 3/04847* (2013.01); *H03K 17/96* (2013.01); *H03K 2217/96038* (2013.01)

(58) Field of Classification Search
CPC ...... G06F 3/0418; G06F 3/046; G06F 3/0484; G06F 3/04847; G06F 3/0488; G06F 3/041; H03K 17/96; H03K 2217/96038
See application file for complete search history.

(56) References Cited

U.S. PATENT DOCUMENTS

| | | | |
|---|---|---|---|
| 7,755,616 B2 * | 7/2010 | Jung .................... | G02F 1/13338 345/173 |
| 7,952,563 B2 * | 5/2011 | Park ........................ | G06F 3/042 178/18.01 |
| 8,576,202 B2 | 11/2013 | Tanaka et al. | |
| 8,890,831 B2 | 11/2014 | Burns et al. | |

(Continued)

FOREIGN PATENT DOCUMENTS

| | | |
|---|---|---|
| KR | 10-1454226 B1 | 10/2014 |
| KR | 10-1496367 B1 | 3/2015 |

(Continued)

*Primary Examiner* — Kwang-Su Yang

(74) *Attorney, Agent, or Firm* — Sughrue Mion, PLLC

(57) ABSTRACT

There is provided a display apparatus, which includes a display configured to display a UI including a plurality of items; a sensor configured to generate electromotive force to a closed loop which is included in the display and sense a user's touch based on a change in the electromotive force which is generated in the closed loop; and a processor configured to execute a function which corresponds to an item touched by a user from among the plurality of items based on a size of the change in the electromotive force generated in the closed loop.

20 Claims, 14 Drawing Sheets

(56) References Cited

U.S. PATENT DOCUMENTS

| | | | |
|---|---|---|---|
| 9,201,105 B2 | 12/2015 | Iida et al. | |
| 9,300,147 B2 * | 3/2016 | Lee | H02J 7/00 |
| 9,678,604 B2 * | 6/2017 | Lee | G06F 1/182 |
| 2010/0001893 A1 * | 1/2010 | Kim | G08C 17/02 |
| | | | 341/176 |
| 2010/0238121 A1 * | 9/2010 | Ely | G06F 3/044 |
| | | | 345/173 |
| 2010/0297952 A1 * | 11/2010 | Rofougaran | H01Q 21/061 |
| | | | 455/73 |
| 2014/0096616 A1 * | 4/2014 | Jeon | G01L 5/04 |
| | | | 73/777 |
| 2015/0185949 A1 * | 7/2015 | Oh | G06F 3/0488 |
| | | | 345/173 |
| 2016/0117026 A1 * | 4/2016 | Ahn | G06F 3/046 |
| | | | 345/174 |

FOREIGN PATENT DOCUMENTS

| | | |
|---|---|---|
| KR | 10-1565822 B1 | 11/2015 |
| KR | 10-2016-0049145 A | 5/2016 |
| WO | 2013/132736 A1 | 9/2013 |

\* cited by examiner

TOUCH DISPLAY APPARATUS BY USING ELECTROMOTIVE FORCE AND METHOD FOR CONTROLLING THEREOF

CROSS-REFERENCE TO RELATED APPLICATIONS

This application claims priority from Korean Patent Application No. 10-2016-0148512, filed on Nov. 9, 2016 in the Korean Intellectual Property Office, the disclosure of which is incorporated herein by reference in its entirety.

BACKGROUND

1. Field

Apparatuses and methods consistent with exemplary embodiments of the present disclosure relate to a display apparatus and a controlling method thereof and, more particularly, to a display apparatus which senses a user's touch by using electromotive force which is generated by a user's touch and a controlling method thereof.

2. Description of the Related Art

A touch sensing device such as a touch pad is an input device provided in a display apparatus and capable of providing an input method using its own body without a separate device such as a mouse and a keyboard. The touch sensing device is widely applied to portable electronic devices for which a separate input device such as a notebook is difficult to be used.

In addition, it is widely applied to a variety of electronic devices such as a touch screen, a recent mobile phone, a Personal Digital Assistant (PDA), navigation, and the like, which are attached to a display panel of a touch sensing device and may provide an intuitive input method to a user. In particular, as the demand for smartphones has recently increased, the adoption rate of a touch screen has increased steadily as a touch sensing device capable of providing various input methods in a limited form factor.

The touch sensing device applied to the electronic device may be realized as a capacitive type, an infrared (IR) type, a surface acoustic wave (SAW) type, an in-cell type or the like according to a method of sensing a touch input.

However, the electrostatic capacitance method requires a transparent electrode such as Indium Tin Oxide (ITO) or silver to be applied to the front surface of the display, and the thickness is changed according to the resistance value, and the transparency is not 100%, thereby causing a problem of image quality deterioration. In addition, the infrared method requires inserting a sensor into a bezel of a display, and therefore the thickness of the bezel and power consumption is increased. In addition, the ultrasonic method requires a separate structure, and therefore the thickness of the bezel is increased. Also, a module of the structure must float for ultrasonic transmission.

The in-cell method is vulnerable to external light, and there is a problem that the image quality deteriorates, the resolution degrades, and the cost increases depending on the size of the screen.

Accordingly, there is a need for a technique for detecting the touch of a user without deteriorating design quality such as thickening of the bezel and reducing image quality.

SUMMARY

Exemplary embodiments address at least the above problems and/or disadvantages and other disadvantages not described above. Also, the exemplary embodiments are not required to overcome the disadvantages described above, and may not overcome any of the problems described above.

The present disclosure includes one or more exemplary embodiments that may address and/or solve the above-mentioned needs, and it is an object of the one or more exemplary embodiments of the present disclosure to provide a display apparatus that senses a user's touch using an induced electromotive force generated by a user's touch, and a control method thereof.

According to an aspect of an exemplary embodiment, there is provided a display apparatus comprising: a display configured to display a User Interface (UI) including one or more items; a sensor configured to: generate an electromotive force in a closed loop circuit, which is provided in a layer of the display, and sense a change in the electromotive force, which is generated in the closed loop circuit; and a processor configured to: determine a touch input based on the sensed change in the electromotive force, and execute a function which corresponds to an item touched by the touch input, among the one or more items, based on a size of the change in the electromotive force generated in the closed loop circuit.

The sensor may be disposed in a back side of the display.

The display may comprises: a backlight layer configured to emit light; and an LCD layer configured to selectively transmit the light emitted from the backlight layer, wherein the sensor is disposed at a back side of the backlight layer.

The display apparatus may further comprise: a color filter layer on a front side of the display.

The sensor may further comprise: a coil; and a power source configured to be serially connected to the coil and supply AC power, wherein the sensor may be further configured to determine the touch input based on a change in inductance of the coil corresponding to the sensed change in the electromotive force which is generated in the closed loop circuit.

The sensor may be further configured to identify which of the one or more items is touched by the touch input based on a size of the change in the inductance.

The one or more items may comprise two or more of a power source, a channel up, a channel down, a volume up, a volume down, an external input, and a menu.

The display apparatus may further comprise: another sensor which may be spaced apart from the sensor, wherein the processor may be further configured to determine a position of the touch input by comparing a size of inductance change determined by the sensor and the other sensor respectively.

The sensor may determine only the touch input in a predetermined area of the display.

The display apparatus may further comprise a chassis configured to protect the display, wherein the sensor is disposed between the chassis and the display.

The display apparatus may further comprise a filter configured to remove an area in which frequency is less than a predetermined value from among values of change in the electromotive force sensed by the sensor.

The touch input maybe a user's touch.

According to an aspect of an exemplary embodiment, there is provided a controlling method of a display apparatus, the method comprising: displaying a User Interface (UI) including one or more items on a display of the display apparatus; transmitting a magnetic field to a closed loop circuit included in a layer of the display using an inductor of a sensor, the magnetic field generating an electromotive force in the closed loop circuit; sensing a change in inductance of the inductor corresponding to a change in the electromotive force; determining a touch input based on the sensed change in the electromotive force; and executing a function corresponding to an item touched by the touch input, among the one or more items, based on a size of the sensed change in inductance.

The one or more items may comprise two or more of a power source, a channel up, a channel down, a volume up, a volume down, an external input, and a menu.

The executing may comprise identifying which of the one or more items is touched by the touch input based on a size of the change in the inductance, wherein the determining comprises determining only the touch input in a predetermined area of the display.

The determining may comprise determining an item touched by the touch input by comparing a size of the inductance change generated in each of a plurality of sensors.

The controlling method may further comprise: removing an area in which frequency is less than a predetermined value from among the sensed inductance.

The touch input may be a user's touch.

According to an aspect of an exemplary embodiment, there is provided a display apparatus comprising: a sensor comprising a coil configured to generate a magnetic field in accordance with an Alternating Current (AC) voltage applied to the coil; a display configured to display a User Interface (UI), the display comprising a layer provided with a closed loop circuit configured to generate an electromotive force in response to the magnetic field; and a processor configured to determine a location of a touch input based on an intensity level of the electromotive force generated by closed loop circuit.

When a distance between the coil and the layer of the display having the closed loop circuit changes, in response to an external force, the processor may be further configured determine the location of the touch input based on a change in the intensity level of the electromotive force generated by the closed loop circuit corresponding to the change in the distance between the coil and the layer of the display having the closed loop circuit.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
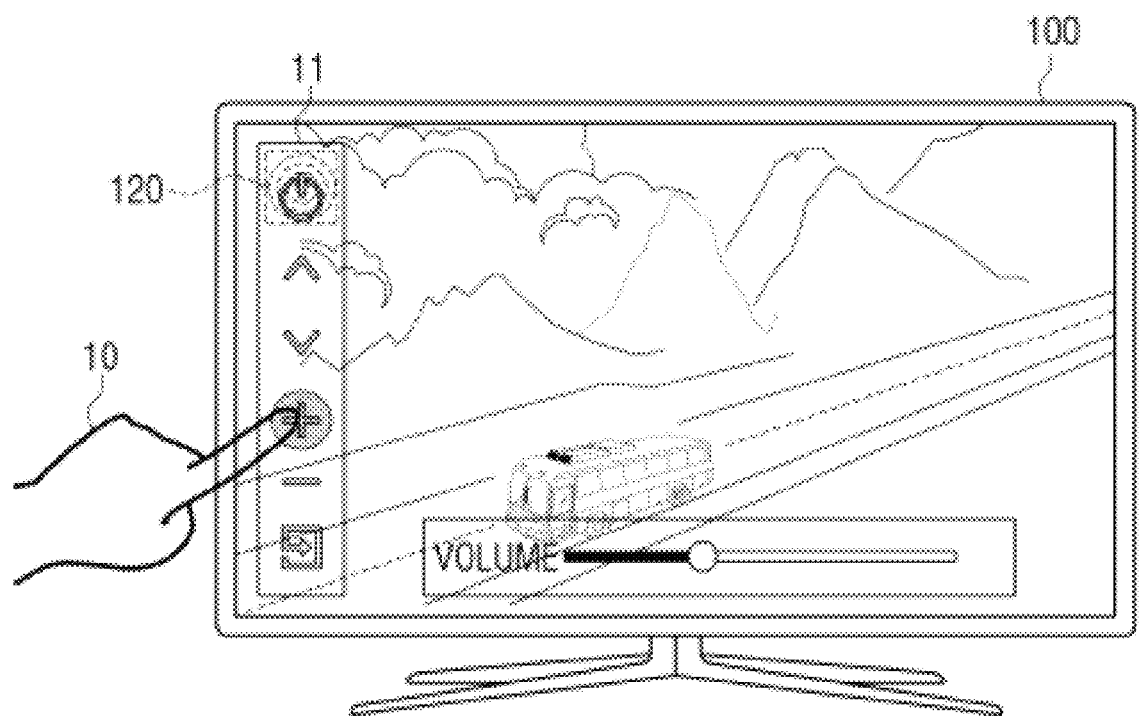
FIG. 1 illustrates a display apparatus which is capable of sensing a user's touch according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments may be practiced without those specifically defined matters. Also, well-known functions or constructions are not described in detail since they would obscure the description with unnecessary detail.

The terms such as "first," "second," and so on may be used to describe a variety of elements, but the elements should not be limited by these terms. The terms are used only for the purpose of distinguishing one element from another.

A singular expression includes a plural expression, unless otherwise specified. It is to be understood that the terms such as "comprise" or "consist of" are used herein to designate a presence of characteristic, number, step, operation, element, component, or a combination thereof, and not to preclude a presence or a possibility of adding one or more of other characteristics, numbers, steps, operations, elements, components or a combination thereof.

In the example embodiments of the present disclosure, a 'module' or a 'unit' may perform at least one function or operation, and be implemented as hardware (e.g., circuitry) or software, or as a combination of hardware and software. Further, except for the 'module' or the 'unit' that has to be implemented as particular hardware (e.g., a dedicated processor), a plurality of 'modules' or a plurality of 'units' may be integrated into at least one module and implemented as at least one processor.

FIG. 1 illustrates display apparatus which is capable of sensing a user's touch according to an exemplary embodiment.

Referring to FIG. 1, a display apparatus 100 according to an exemplary embodiment of the present disclosure includes a sensor 120 capable of sensing a user's touch. Specifically, the display apparatus 100 may perform an operation corresponding to the sensed user's touch position using the sensor 120. Although FIG. 1 illustrates only one sensor 120, the display apparatus 100 may include two or more sensors, and the arrangement of the sensors may be implemented in various forms.

The display apparatus 100 may display an area 11 that may be selected by a touch of the user 10 on a part of the screen. According to another exemplary embodiment, a plurality of areas 11 may be selected by a touch of the user 10 on a part of the screen. For example, the plurality of areas 11 may include at least one of a power source area, a channel up area, a channel down area, a volume up area, a volume down area, an external input area, and a menu area. Although FIG. 1 shows that six regions are arranged in a bar shape, the number, type, and arrangement of regions are not limited thereto.

In the meantime, FIG. 1 illustrates that the display apparatus 100 senses a touch by a finger of the user 10, but in actual implementation, the display apparatus 100 may also sense touches by all possible objects which may apply pressure such as a stylus pen, a general pen, a corner of a book and so on.

Meanwhile, the display apparatus 100 may perform an operation corresponding to the touch of the user 10 sensed. Specifically, the display apparatus 100 may determine the position of the user's touch among a plurality of items included in the displayed UI based on the signal detected by the sensor 120, and perform a function corresponding to the item that the user touched. According to an exemplary embodiment, the display apparatus 100 may determine the position of the user's touch based on the size of the signal sensed by the sensor 120. For example, in FIG. 1, the display apparatus 100 may increase the volume of the image by touching a '+' region corresponding to a volume increase.

Meanwhile, the display apparatus 100 according to an exemplary embodiment of the present disclosure may be a TV, but in actual implementation, the display apparatus 100 may be implemented by various display apparatus such as a smart phone, a notebook computer, a monitor of a desktop PC, and a tablet PC.

Figure 2:
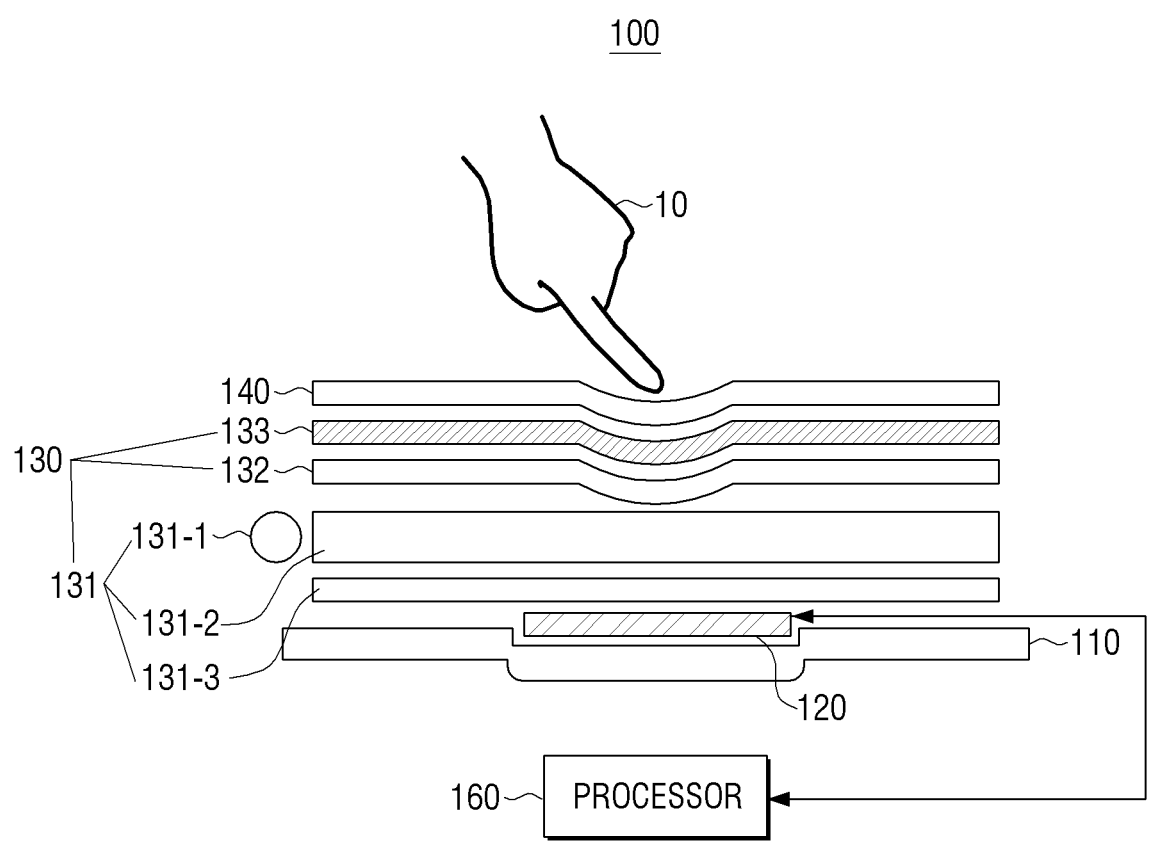
FIG. 2 illustrates a schematic structure of a display apparatus according to an exemplary embodiment.

FIG. 2 is a diagram showing a schematic structure of a display apparatus according to an exemplary embodiment of the present disclosure. Specifically. FIG. 2 is a side view of the display apparatus 100. Hereinafter, for the sake of convenience of description, the user side of the display apparatus 100 is referred to as a front side of the display apparatus 100, and the opposite side is referred to as a rear side. That is, in FIG. 2, the upper side is referred to as the front side of the display apparatus 100, and the lower side is referred to as the rear side of the display apparatus 100. Meanwhile, 'front end' described below has the same meaning as 'front side' and 'rear end' has the same meaning as 'rear side'.

Referring to FIG. 2, the display apparatus 10 includes a chassis 110, a sensor 120, a display 130, a color filter layer 140, and a processor 160.

The chassis 110 protects the display 130 displaying an image. Specifically, the chassis 110 may protect the display 130 from the outside. Generally, the configuration for protecting the display 130 includes a top chassis and a bottom chassis. In this specification, the chassis 110 is referred to as a bottom chassis. Meanwhile, the chassis 110 may further protect the configurations necessary for displaying an image, such as the color filter layer 140, in addition to the display 130.

The chassis 110 may be a plate-shaped aluminum (Al) alloy. In addition, it may be in the form of a plate including a bend for mounting the sensor 120 or the like. Meanwhile, the features of the chassis 110 other than those described above are the same as those of the conventional chassis, and a description thereof will be omitted.

The sensor 120 may sense the user touch 10. According to an exemplary embodiment, the sensor 120 may be a printed circuit board (PCB) printed with a coil pattern. However, the present disclosure is not limited thereto, and any sensor including an inductor that generates an induced electromotive force and may detect a change in induced electromotive force may be used. Meanwhile, the display apparatus 100 may include at least one sensor 120.

Meanwhile, the sensor 120 may be attached to the chassis 110, and may sense the presence or absence of a user's touch and position using the induced electromotive force generated by the user's touch 10. According to an exemplary embodiment, the sensor 120 may be disposed at the rear end of the display 130. That is, the sensor 120 may be disposed between the display 130 and the chassis 110. To be specific, the display 130 may include a backlight layer 131, and the sensor 120 may be disposed at a rear end of the backlight layer 131. By disposing the sensor 120, which is a PCB, on the rear end of the display 130 including the backlight layer 131, it is possible to obtain a display apparatus capable of touch sensing without deterioration in image quality.

Meanwhile, the sensor 120 may detect only a user's touch generated in a predetermined area of the display 130. Specifically, the transparent electrode has to be applied to the entire surface of the display 130 in order to detect the touch. On the other hand, the sensor 120 is disposed only in the area where the menu to be touched by the user is displayed, and the user's touch of the corresponding area may be detected only. By arranging the sensor 120 in only the necessary area to sense the user's touch, there is the effect that the cost for realizing the touch function is reduced.

Meanwhile, the sensor 120 may sense the user's touch 10 based on a change in induced electromotive force generated in the electrode layer 133, which will be described below. Specifically, the sensor 120 generates an induced electromotive force in a closed loop included in the electrode layer 133 of the display 130 by the AC power supplied by the control of the connected processor 160. The sensor 120 may sense a user's touch based on the change in the induced electromotive force generated as the distance between the electrode layer 133 and the sensor 120 is changed according to movements of the electrode layer 133 by the user's touch 10. A method of detecting the user's touch using the induced electromotive force will be described in detail with reference to FIG. 4 and FIG. 14. As described above, the user's touch 10 is sensed by the movement of the electrode layer 133 by the pressure from the outside. Thus, it is not limited to the tools used for the touch, and even the touch of the user in the state of wearing gloves may be detected.

In the meantime, the sensor 120 may include a coil, AC power unit, resistance and the like. The detailed configuration of the sensor 120 will be described with reference to FIGS. 3 and 4 below.

The display 130 is a configuration to display an image. To be specific, the display 130 may display a User Interface (UI) including a plurality of items. According to an exemplary embodiment, the UI may be displayed on a part of an area of the display 130.

According to an exemplary embodiment, the display 130 may display images by selectively transmitting light using the electrodes. In order to realize this, the display 130 may include a backlight layer 131, an LCD layer 132, and an electrode layer 133. Meanwhile, the display 130 may further include a plurality of films in addition to the backlight layer 131 and the LCD layer 132.

Referring to FIG. 2, the backlight layer 131 may include a backlight 131-1 for emitting light and a light guide plate 131-2 for uniformly transmitting light so that the emitted light travels in a front direction of the display apparatus 100. According to an exemplary embodiment, the backlight 131-1 may be a cold cathode fluorescent lamp (CCFL) or a light emitting diode (LED). The light guide plate 131-2 may be a transparent acrylic panel and is not deformed even by a user's touch. However, in actual implementation, the backlight 131-1 may be implemented as a form directly emitting light on the entire surface of the display 130 without the light guide plate.

The backlight layer 131 may further include a reflective film 131-3 for reflecting the light emitted from the backlight 131-1 and the light transmitted through the light guide plate 132-2 in the rear direction, possibly reducing the loss of light.

On the other hand, the LCD layer 132 is a panel in which liquid crystals are regularly arranged, and the arrangement of each liquid crystal may be changed according to an electric signal applied by the electrode layer 133. Due to this, liquid crystal becomes directional, having predetermined patterns, and the light transmitted from the backlight layer 131 passes through each liquid crystal and is refracted in different patterns. The light passes through the color filter layer 140 and the polarizing filter (not shown) may be a pixel having different colors and brightness.

The electrode layer 133 is a configuration to apply voltage to the LCD layer 132 and may include a transparent electrode. According to an exemplary embodiment, the transparent electrode may be at least one of ITO. Graphene), PEDOT (Poly(3,4-ethylenedioxythiophene)) and carbon nano tube (CNT).

Here, the electrode layer 133 may have a closed loop due to the transparent electrode included therein. As a result, the induced electromotive force is generated by the AC current of the sensor 120, and the induced electromotive force is changed due to the movement of the closed loop due to the external force, and the distance from the sensor 120 is slightly changed. Thus, the display apparatus 100 may detect that there is a user's touch.

The color filter layer 140 is disposed at the front end of the electrode layer 133 and is configured to realize color in the white light emitted from the backlight layer 131. Specifically, the color filter layer 140 may be a resin film containing three basic colors (red (R), green (G), and blue (B)) dyes and pigments.

It has been described that the display 130 is different from the filter layer 140, but in actual implementation, the display and the filter layer may be commonly referred to as an 'LCD cell.'

The processor 160 is disposed at the back end of the chassis 110 and performs the operation of controlling each configuration of the display apparatus 100 described above. Specifically, the processor 160 applies an AC voltage to the sensor 120 to sense a change in the induced electromotive force of the electrode layer 133, grasps the position of the user's touch based on the sensed signal, and may control the display apparatus 100 to perform the operation corresponding to the grasped position. A more detailed operation of the processor 160 will be described below with reference to FIG. 3.

The display apparatus 100 may further include a plurality of films, window covers, and the like as needed, and may further include a plastic cover for protecting various configurations of the display apparatus 100 from the outside.

On the other hand, as described above, touch detection may be performed only by adding a sensor to an existing LCD cell. Particularly, since the sensor is positioned at the back end of the backlight, a display apparatus with no deterioration in image quality and less limitation in design such as thick bezel may be obtained.

Figure 3:
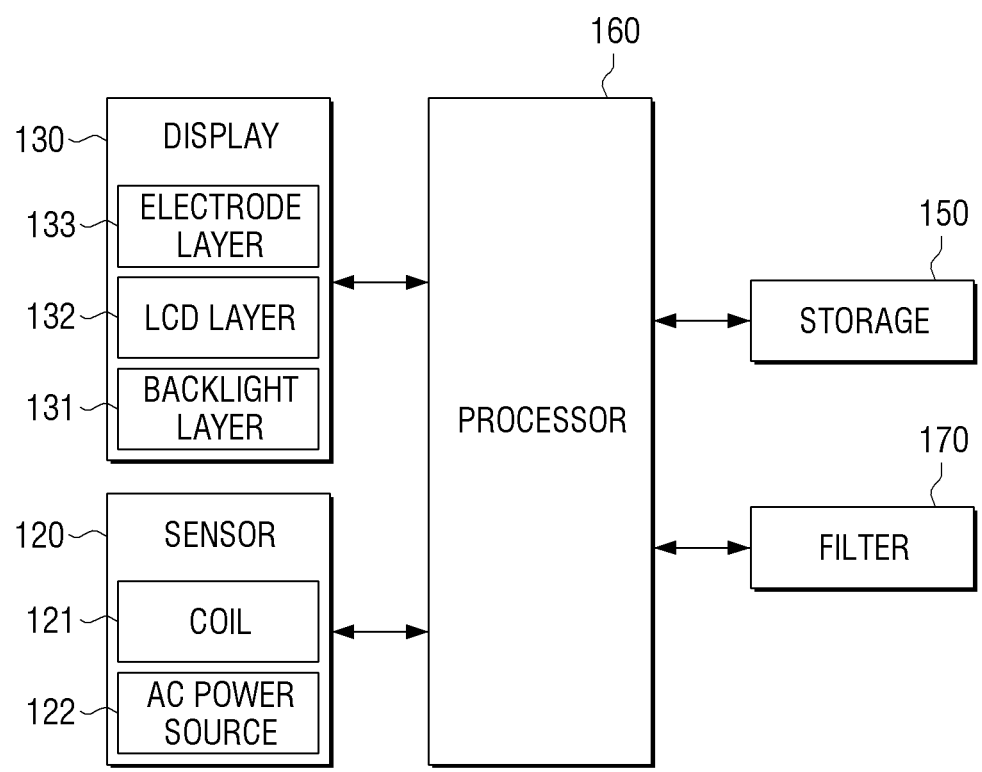
FIG. 3 is a block diagram which illustrates a schematic structure of a display apparatus according to an exemplary embodiment.

FIG. 3 is a block diagram which illustrates a brief configuration of the display apparatus according to an exemplary embodiment.

Referring to FIG. 3, the display apparatus 100 includes a sensor 120, a display 130, and a filter 170. Although not shown in FIG. 3, the display apparatus 100 may further include a chassis, a color filter layer, and the like. However, the omitted configuration is the same as the description of FIG. 2 described above, and the description of FIG. 2 replaces the description of the omitted configuration.

The sensor 120 may include a coil 121 and an AC power source 122. Specifically, when the AC power source unit 122 applies an AC voltage to the coil 121 under the control of the processor 160, the sensor 120 performs an interaction with the display 130 having a closed loop by the transparent electrode and the user may sense the user's touch. Here, the coil 121 may be an inductor, and the AC power source unit 122 and the coil 121 may be connected in series. Although the AC power source unit 122 and the processor 160 are shown as separate configurations in FIG. 3, the AC power source unit 122 and the processor 160 may have the same configuration in actual implementation.

According to an exemplary embodiment, the sensor 120 may sense the user's touch based on the change in the induced electromotive force generated in the coil 121 and the display 130. Specifically, the sensor 120 may sense the user's touch based on the change in inductance of the coil 121.

Here, the inductance is an amount representing the ratio of the counter electromotive force caused by the electromagnetic induction due to the change in the current flowing in the circuit, and the sensor 120 may identify that the user's touch is with respect to which item from among a plurality of items included in the UI displayed in the display 130 based on the size of the change in the inductance. A more detailed detection process will be described with reference to FIG. 4. According to an exemplary embodiment, the plurality of items may include at least one of a power source, a channel up, a channel down, a volume up, a volume down, an external input, and a menu, but is not limited thereto.

The plurality of sensors 120 may be disposed and spaced apart from each other. According to an exemplary embodiment, the display apparatus 100 may determine the location of the user's touch by comparing the size of the signals sensed by the respective sensors 120. Specifically, the display apparatus 100 may compare the size of the change in inductance sensed by each sensor 120, and determine an item that the user touches among a plurality of items displayed on the display 130.

Meanwhile, the display 130 may include a backlight layer 131, an LCD layer 132, and an electrode layer 133. Specifically, the backlight layer 131 emits light under the control of the processor 160, and directs the emitted light toward the front side of the display. The backlight layer 131 is disposed at the back end of the LCD layer 132 and may not be deformed by an external force such as a user's touch.

The LCD layer 132 may selectively transmit light by aligning the liquid crystal by the electrode layer 133 to which a voltage is applied under the control of the processor 160. Specifically, the LCD layer 132 may transmit light transmitted from the backlight layer 131 to control brightness, direction, refraction, and so on of light.

The electrode layer 133 includes a transparent electrode and a voltage is applied to the LCD layer 132 under the control of the processor 160 to change the arrangement of liquid crystals. On the other hand, the electrode layer 133 has a closed loop inside the included transparent electrode, and when the external force such as a user's touch is applied, the distance between the electrode layer 133 and the coil 121 of the sensor 120 changes, and electromotive force may occur.

As described above, the display apparatus 100 according to the present disclosure has an effect that touch detection may be performed by adding only a sensor having an inductor to an existing LCD cell, and touch detection is possible without deterioration of image quality by disposing a sensor at a back end of the backlight.

Meanwhile, the filter 170 may remove an area of the signal detected by the sensor 120 where the frequency is less than a predetermined value. Specifically, when the power of the display apparatus 100 is turned on and an image is reproduced, a drift may occur in the entire detected signal. According to an exemplary embodiment, the filter 170 may correct the drift by removing the low frequency of the sensed signal. For example, the filter 170 may be a high pass filter (HPF) that passes only high frequencies and removes low frequencies. An exemplary embodiment for correcting the drift will be described in detail below with reference to FIGS. 8 to 11.

The storage 150 may store position information corresponding to size of a plurality of inductance changes on the display 130. To be specific, the storage 150 may store information on items corresponding to the size of the detected inductance change among a plurality of items included in the UI, in association with the UI displayed on the display 130.

Meanwhile, when there are a plurality of sensors 120, the storage 150 may store position information corresponding to the size of the inductance change of each sensor. Specifically, the storage 150 may match and store a value obtained by comparing the size of the inductance change of each sensor and a corresponding item among a plurality of items included in the UI, respectively.

The processor 160 may control each configuration of the display apparatus 100. To be specific, the processor 160 may enable the sensor 120, the display 130, and the electrode layer 133 to perform each operation.

Meanwhile, the processor 160 may control each configuration of the display apparatus 100 to perform an operation corresponding to the user touch sensed by the sensor 120. Specifically, the processor 160 may control the sensor 120 to identify which of a plurality of items the user touches based on the size of the sensed signal. Meanwhile, the processor 160 may receive the sensed signal from the sensor 120 and may identify the location of the user's touch based on the received signal.

According to an exemplary embodiment, the processor 160 may determine that a user touches an item by matching a size of the sensed signal from the user's touch with prestored information corresponding to a plurality of items included in the UI. According to an exemplary embodiment, the prestored information may be stored in the storage 150.

Meanwhile, the processor 160 may perform an operation corresponding to the user's touch based on the position of the identified user's touch and the UI displayed during the user's touch. Specifically, it is possible to perform a function corresponding to an area in which a user's touch is made in a plurality of items included in the displayed UI. For example, when a plurality of items include at least one of a power source, a channel up, a channel down, a volume up, a volume down, an external input, and a menu, the processor 160 may perform a function corresponding to the area where the user's touch is sensed. On the other hand, the area that may be included in the UI is not limited to the above description, and the number, type, and arrangement of a plurality of items may be variously configured.

Meanwhile, the processor 160 may perform different operations according to the intensity of the user's touch according to the displayed UI during the touch of the user. Specifically, the processor 160 may classify the intensity of the user's touch according to the size of the signal sensed by the sensor 120, and may be implemented to perform different operations according to the intensity of the touch.

Meanwhile, the processor 160 may determine the position of the user's touch based on the signals sensed by the plurality of sensors 120 spaced apart from each other. Specifically, the processor 160 may determine the location of the user's touch by comparing the size of the signal sensed by the plurality of sensors 120. An exemplary embodiment for determining the position of the user's touch using a plurality of sensors will be described below with reference to FIGS. 12 and 13.

In the meantime, though not illustrated, the display apparatus 100 may further include a configuration necessary for operating the display apparatus such as a communicator for communicating with an external device, a storage for storing a program and data, and the like.

Meanwhile, touch sensing is available by only adding a sensor to an existing LCD cell as described above. In particular, a sensor is located at a back end of the backlight, and thus, a display apparatus without deterioration of image quality and limitation of design such as thick bezel may be obtained.

Figure 4:
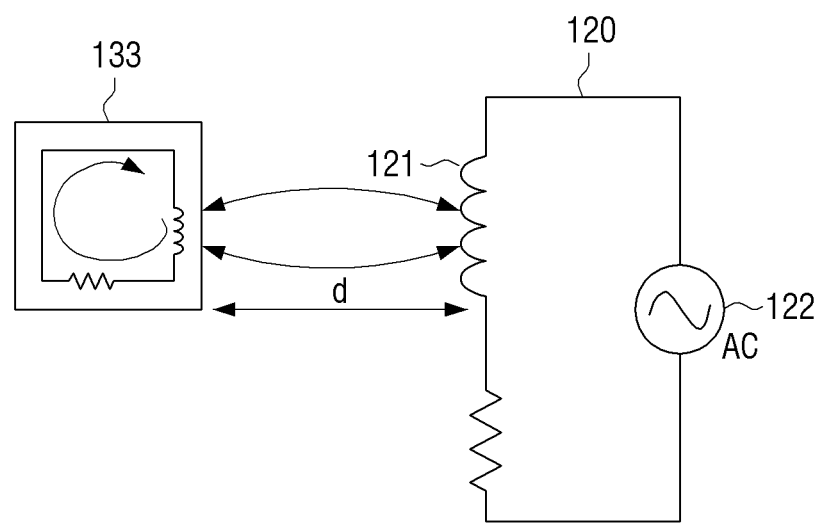
FIG. 4 illustrates a method of sensing a user's touch according to an exemplary embodiment.

FIG. 4 illustrates a method for sensing a user's touch according to an exemplary embodiment.

Referring to FIG. 4, the sensor 120 and the electrode layer 133 are disposed at a distance d. More specifically, the sensor 120 includes a coil 121 and an AC power source 122, and the electrode layer 133 may be a closed loop circuit having an inductor.

First, the display apparatus may control the AC power source unit 122 so that the AC power source unit 122 applies an AC voltage to the coil 121. Magnetic field which is generated from the coil 121 due to applied AC voltage generates eddy current to the closed loop circuit included in the electrode layer 133 and magnetic field is generated in an inductor included in the closed loop circuit by the eddy current.

For the same reason, as a magnetic field is generated in the closed loop included in the electrode layer 133, the current flowing through the sensor 120 is changed, and thus an induced electromotive force is generated in the coil 121 in the direction opposite to the direction in which the current changes.

When the distance d between the electrode layer 133 and the coil 121 of the sensor 120 changes due to an external force such as a user's touch, the induced electromotive force generated in the coil 121 changes, and inductance of the coil 121 changes accordingly.

The sensor 120 may sense the change of the inductance due to the variation of the distance d between the electrode layer 133 and the coil 121 of the sensor 120 and determine whether or not the user touch occurs, and a position thereof according to the size of the sensed signal.

Figure 5:
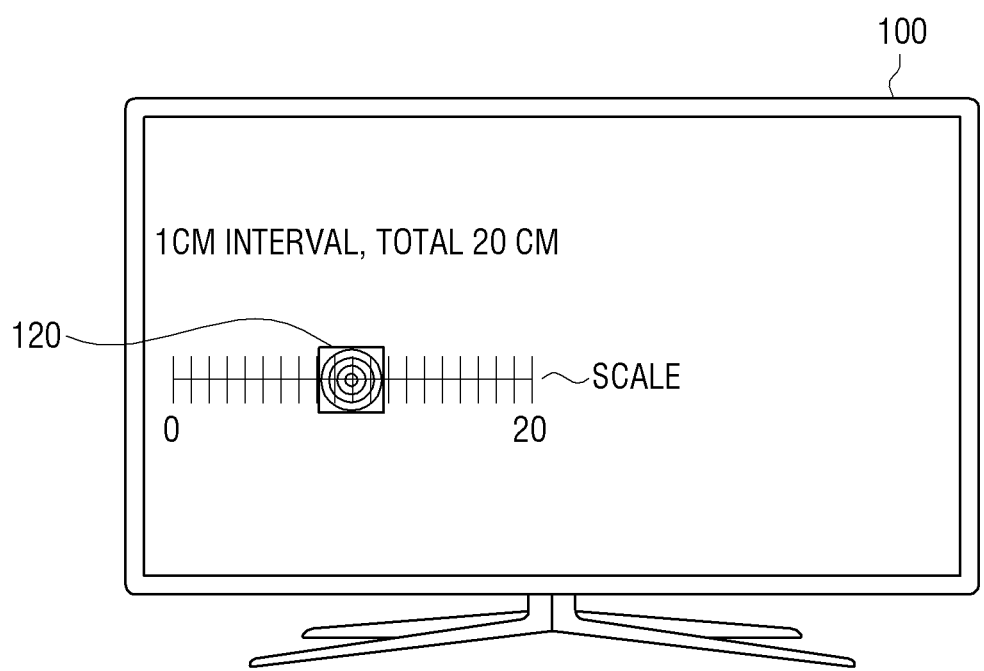
FIGS. 5 and 6 illustrate a user's touch sensed when the display apparatus is powered off according to an exemplary embodiment.
Figure 6:
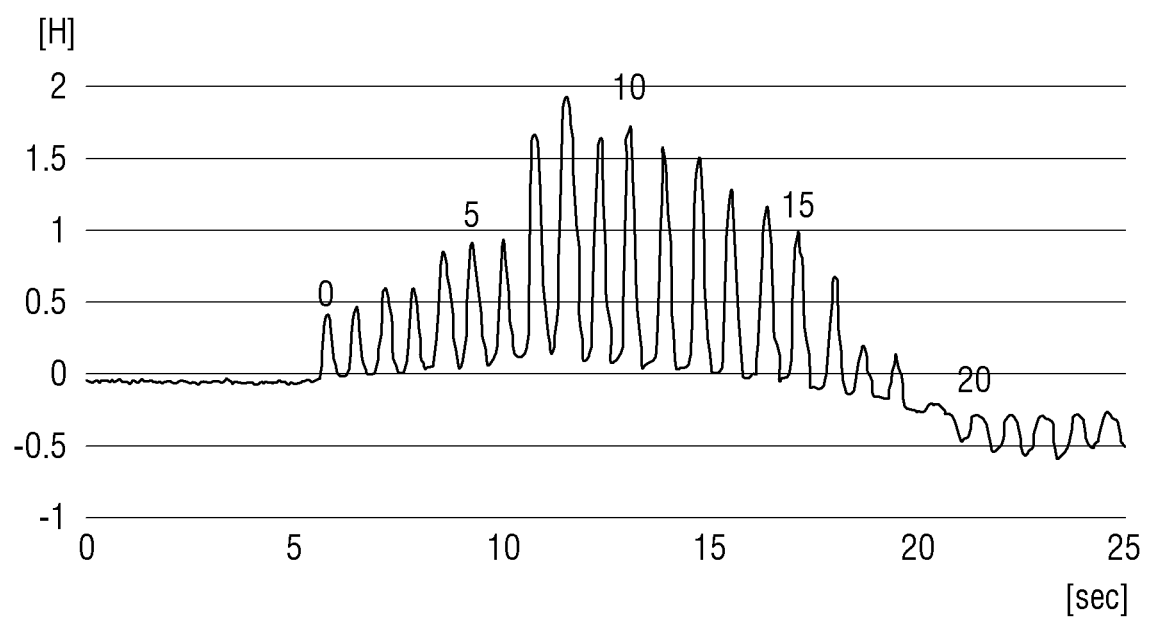

FIGS. 5 and 6 illustrate a user's touch sensed when the display apparatus is turned off according to an exemplary embodiment. According to an exemplary embodiment, in FIGS. 6, 8 and 10, the x-axis denotes time in seconds and the y axis denotes an inductance amount.

Referring to FIG. 5, the sensor 120 may be provided in a part of the display apparatus 100, and the entire 20 cm scale section corresponding to the sensor 120 may be divided into 1 cm intervals. For instance, the result of the output is shown in FIG. 6. In this case, the sensor shown in FIG. 5 is provided inside the display apparatus 100 and is not visible to a user viewing the display apparatus from the outside, and the scale shown in FIG. 5 is only for convenience of explanation, and is not illustrated in the display apparatus.

Referring to FIG. 6, it may be seen that the touch is not performed for about 5 seconds, and touch is performed from 6 seconds by moving by 1 cm from 1 cm to 20 cm once. It may be seen that the variation of the inductance increases as the distance from the sensor 120 decreases, and the variation of the inductance decreases as the distance from the sensor 120 increases.

Accordingly, the display apparatus 100 may identify a position where the user's touch is made according to size of a signal sensed by the sensor.

Figure 7:
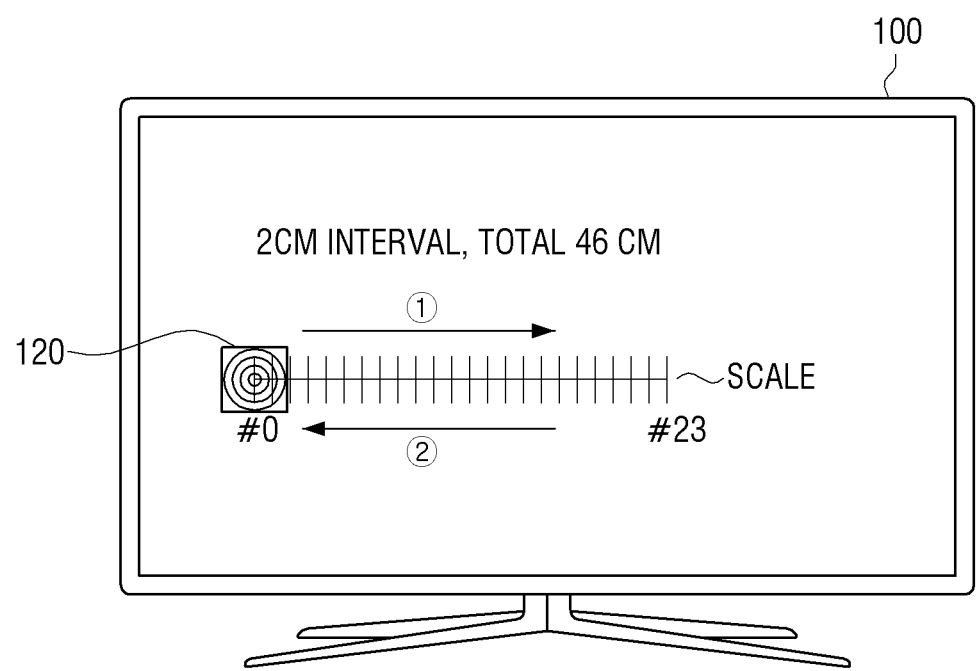
FIGS. 7-9 illustrate a user's touch sensed when the display apparatus is powered on according to an exemplary embodiment.
Figure 8:
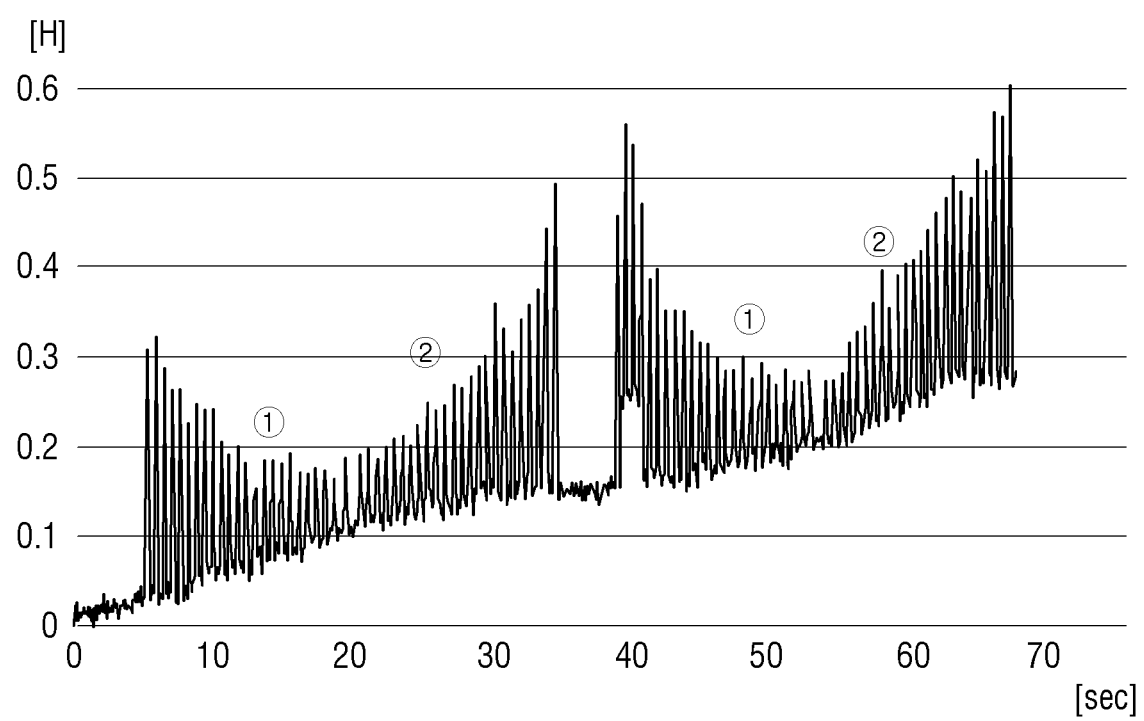
Figure 9:
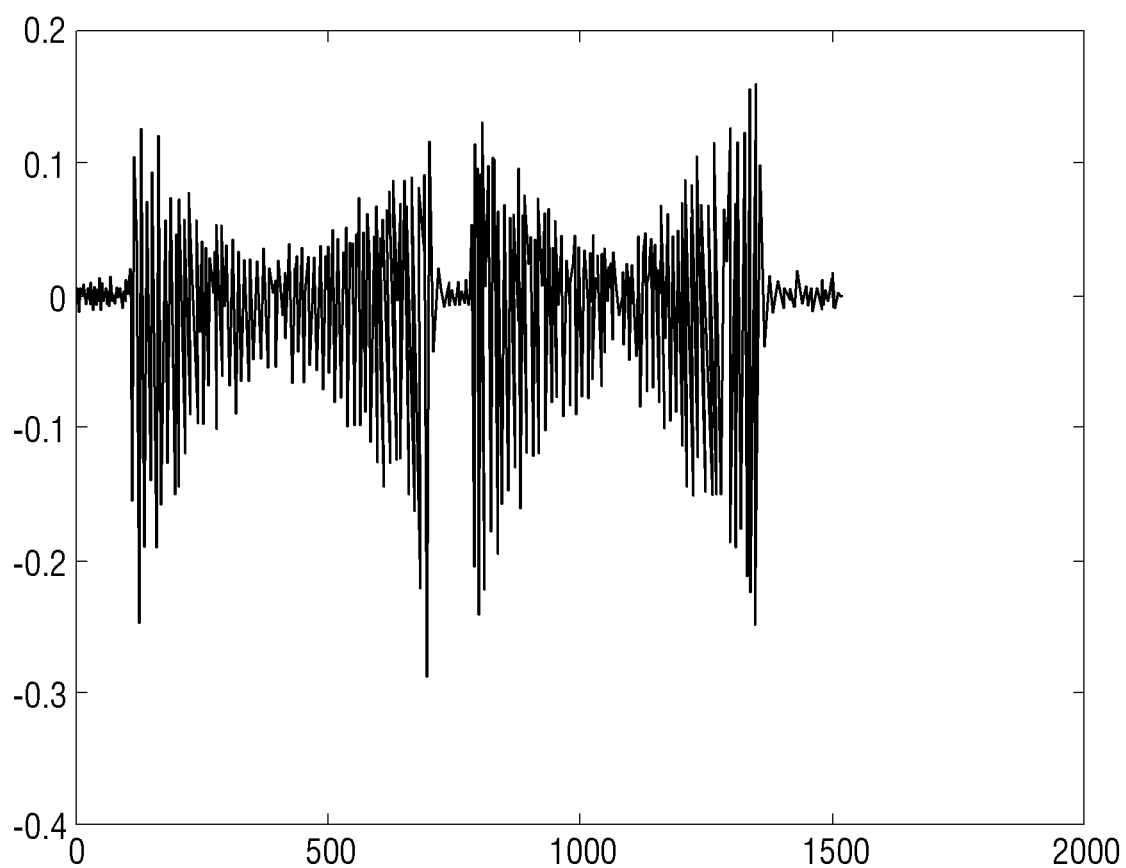

FIGS. 7-9 illustrate a sensed user's touch when the display apparatus is turned on according to an exemplary embodiment.

Referring to FIG. 7, a sensor 120 may be provided in a part of the display apparatus 100, and a nonconductor reciprocates (①, ②) over a full 46 cm section, starting from the sensor 120, and the output result is shown in FIG. 8. Here, for the sake of convenience of explanation, scales were set at intervals of 2 cm. The sensor 120 shown in FIG. 7 is provided in the display apparatus 100 and is not visible to a user viewing the display apparatus from the outside. The scale shown in FIG. 7 is only for convenience of explanation, and is not illustrated in the display apparatus.

Referring to FIG. 8, from about 5 seconds to about 20 seconds, the drag from the scale 0 to the scale 23 (①) shows that the change in inductance decreases from about 5 seconds to about 20 seconds. This is because the sensor 120 is disposed in the region of the scale 0, and the decrease in the inductance is due to the distance of the touch region being away from the sensor 120. Then, from about 20 seconds to about 35 seconds, it is dragged from the scale 23 to the scale 0 (②), which shows that the change in inductance increases from about 20 seconds to about 35 seconds. It is also understood that the reason why the change amount of the inductance increases is that the touch region is getting closer to the sensor 120. In the meantime, since the inductance change has been decreasing and then increasing even after 40 seconds, it may be seen that the same operation of reciprocation (①, ②) from the scale 0 to the scale 23 is performed again.

Referring to FIG. 8, it may be confirmed that the inductance signal is entirely drifted. This is because the display apparatus 100 is powered on and thus is influenced by the inductance of the coil of the sensor 120 due to the current flow between the other components. The process of correcting the drift may be necessary to identify the location and the intensity of the touch based on the size of the sensed signal.

According to an exemplary embodiment, the display apparatus 100 may correct the drift using a filter. Specifically, drift may be corrected using a high-pass filter. In FIG. 8, the inductance gradually increases. However, as a result of the experiment, if the time is lengthened, the inductance may gradually decrease again. That is, since drift occurs at a very low frequency, drift correction may be performed using a high-pass filter that passes only a signal of a high frequency and removes a signal of a low frequency, in order to achieve only the amount of changes by touch.

FIG. 9 shows a result obtained by correcting the result of FIG. 8 by using a high-pass filter. The reference of the inductance change amount does not gradually increase, but is set to zero. Thus, it can be confirmed that the display apparatus 100 may use the signal sensed by the sensor 120 more easily.

As described above, since the touch of the drag type may be detected by using the change amount of the inductance, more functions of the display apparatus may be implemented by the direct touch, thereby improving the convenience of the user.

Figure 10:
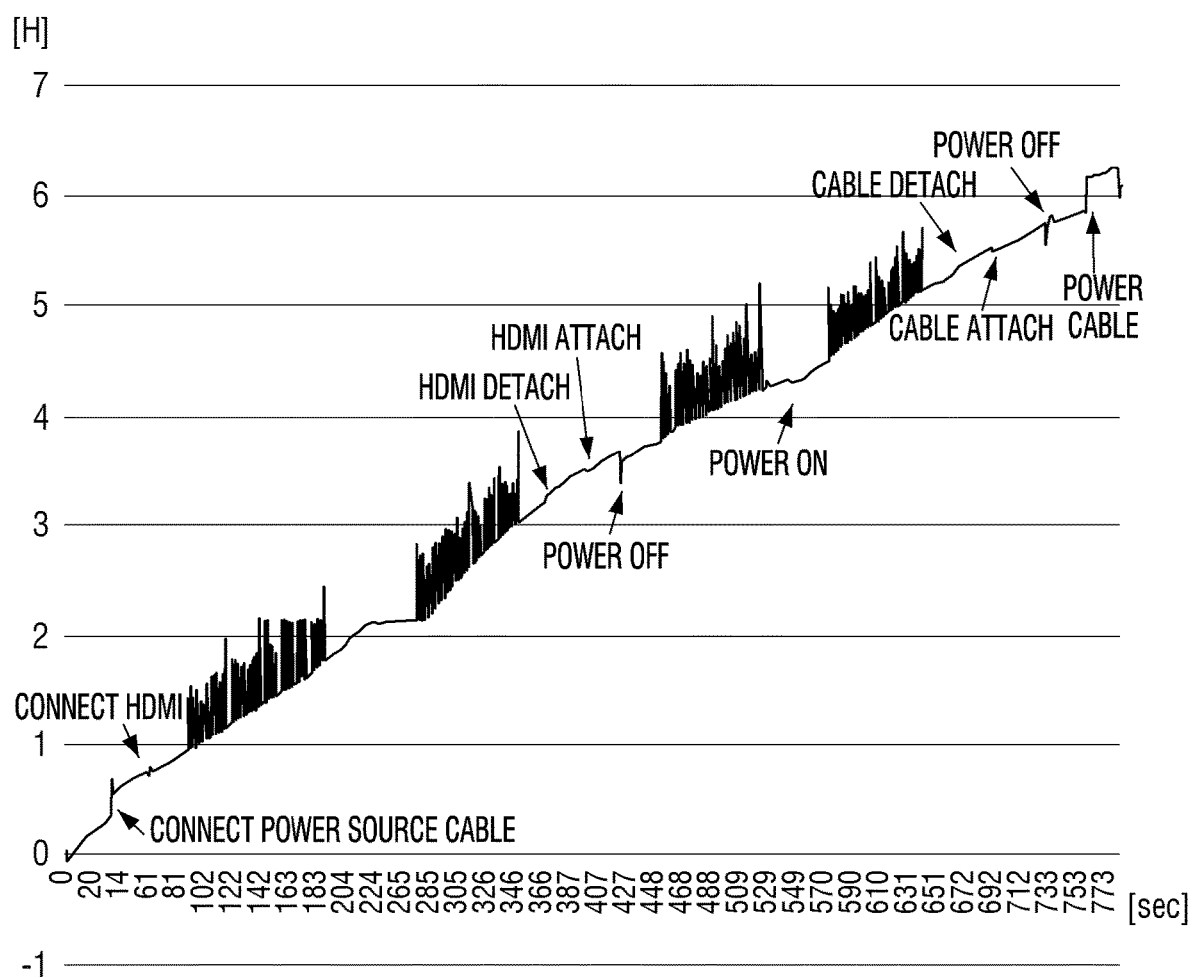
FIGS. 10 and 11 illustrate a user's touch sensed in various states of the display apparatus according to an exemplary embodiment.
Figure 11:
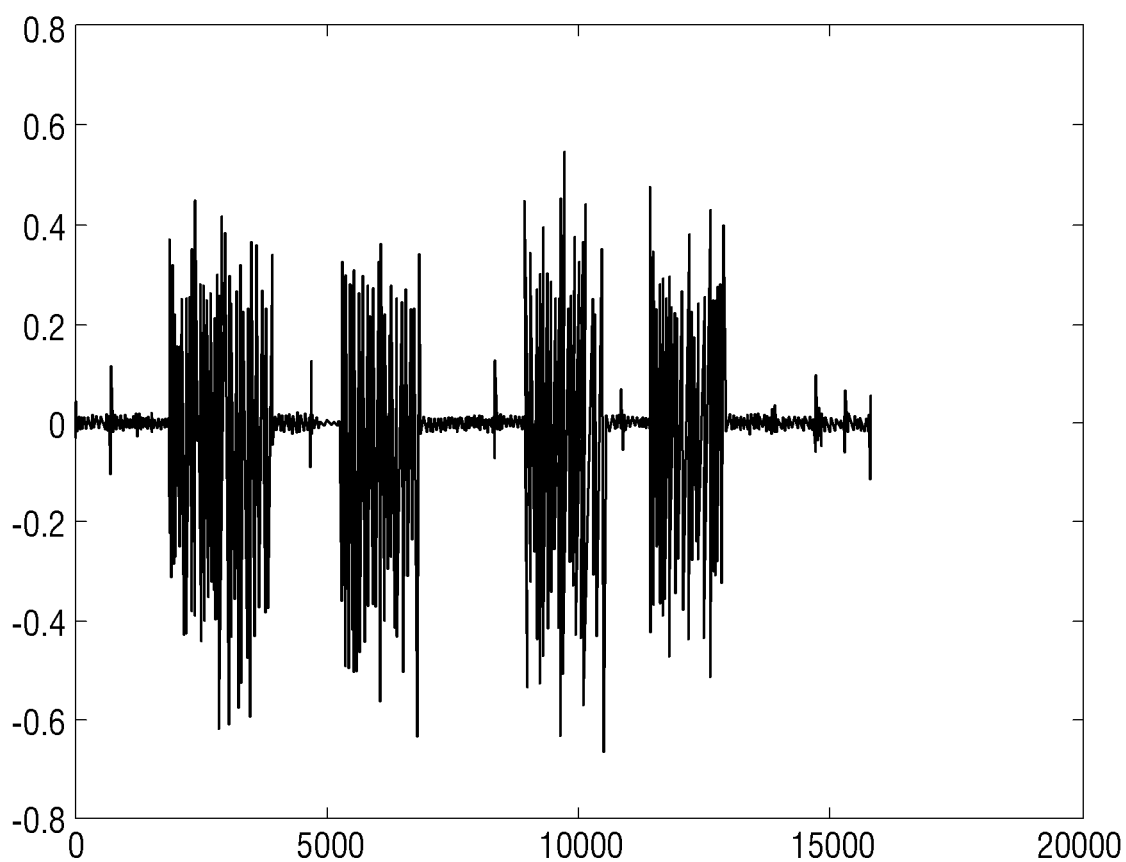

FIGS. 10 and 11 illustrate a user's touch sensed in various states of the display apparatus according to an exemplary embodiment.

The coil of the sensor is also influenced by the flow of current in the other configuration of the display apparatus and thus, the inductance may be temporarily changed even when the power of the display apparatus is turned on or off, or the cable is connected or disconnected to the display apparatus.

Referring to FIG. 10, the touch sensing is performed while various states of the display apparatus are changed, such as power cable detachment. HDMI detachment, cable detachment, and power on/off of the display apparatus. However, at the time when the state of the display apparatus changes, even if the inductance of the coil changes temporarily, the changed inductance may be distinguished from the change of the inductance due to the touch.

In FIG. 10, inductance gradually increases, which requires correction of drift. The result of correcting the output of FIG. 10 is illustrated in FIG. 11.

Referring to FIG. 11, it may be seen that the reference of the inductance change amount does not increase gradually, but is set to zero, so that the display apparatus may more easily use the signal sensed by the sensor. In addition, although a temporal change in inductance is observed in accordance with a change in the state of the display apparatus, a comparison between the intensity of the signal and the length of time is clearly distinguished from the change in inductance due to the touch. Therefore, the display apparatus may identify a user's touch by algorithm to use a signal except temporal change in inductance.

As described above, when a status of the display apparatus changes in a diverse manner, it can be confirmed that there is no problem in sensing a user's touch according to an exemplary embodiment.

Figure 12:
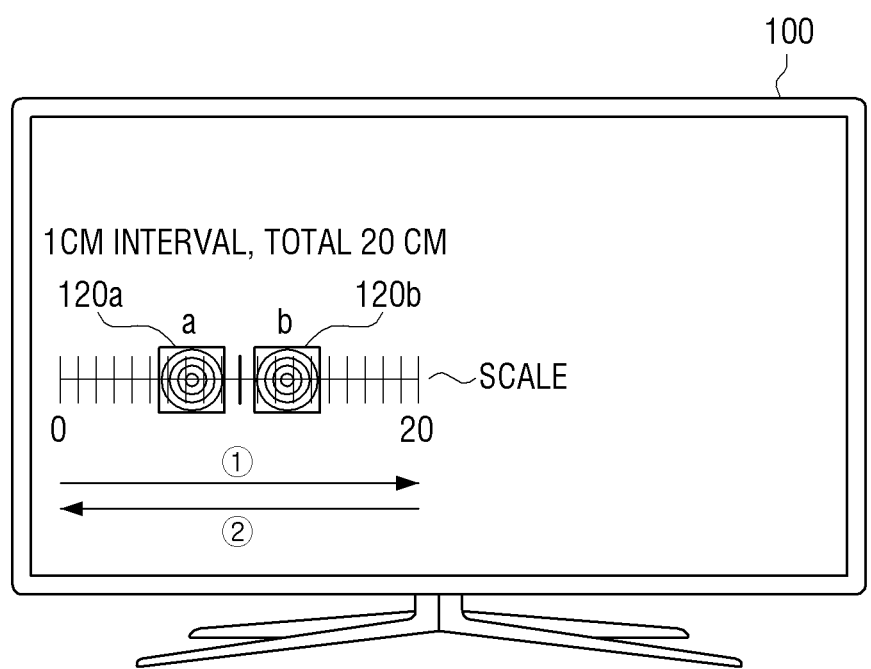
FIGS. 12 and 13 illustrate a user's touch sensed in a display apparatus including a plurality of sensors according to an exemplary embodiment.
Figure 13:
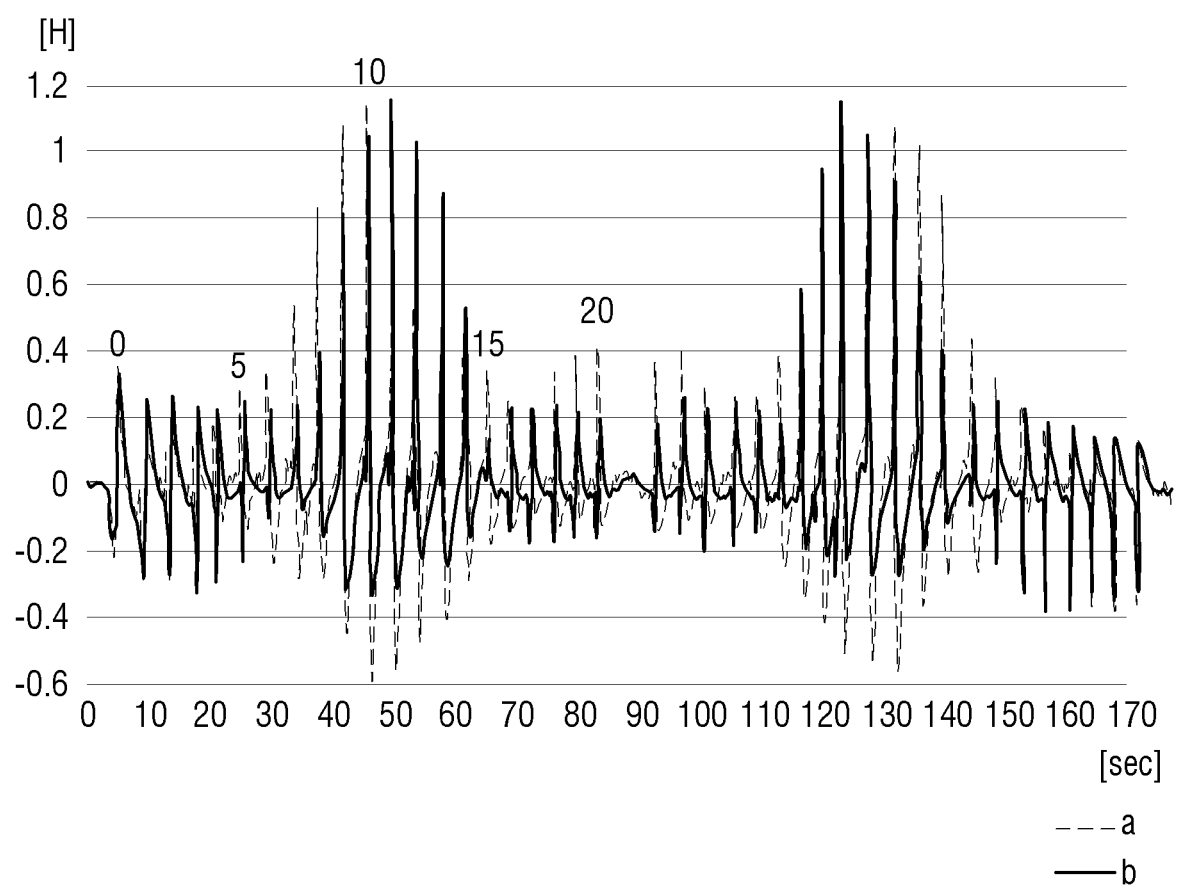

FIGS. 12 and 13 illustrate a user's touch sensed in a display apparatus having a plurality of sensors according to an exemplary embodiment.

Referring to FIG. 12, a plurality of sensors 120a and 120b may be provided in a part of the display apparatus 100 at positions a and b, respectively, and spaced apart from each other, and the plurality of sensors 120 may be disposed with an interval of a size of about 2 cm. The entire 20 cm section of the center of the plurality of sensors 120 was divided into 1 cm intervals and the touch was performed once for each scale using the nonconductor. According to an exemplary embodiment, a touch was performed from the scale 0 to the scale 20 (①) and from the scale 20 to the scale 0 (②).

The output result is shown in FIG. 13. In this case, the sensor shown in FIG. 12 is provided inside the display apparatus 100 and is not visible to the user viewing the display apparatus from the outside, and the scale shown in FIG. 12 is only for convenience of explanation, and is not illustrated in the display apparatus.

The arrangement type of the plurality of sensors 120 shown in FIG. 12 is merely one exemplary embodiment, but the present disclosure is not limited thereto, and it is possible to arrange the sensor 120 without being limited to the positions of the two corners of the upper end, the two corners of the lower end, and diagonal line or the like. In FIG. 12, the number of sensors 120 is two, but three or more of the sensors may be arranged in a mutually spaced arrangement.

Referring to FIG. 13, the touch is performed from about 5 seconds to about 80 seconds, moving from the scale 0 to the scale 20 (①) at intervals of 1 cm, and from about 90 seconds to about 170 seconds, moving from scale 20 to scale 0 (②) at intervals of 1 cm. Referring to FIG. 5, when a touch input on the display apparatus is getting closer to the sensor 120, the change amount of the inductance becomes larger, and when the touch input on the display apparatus is getting farther from the sensor 120, the change amount of the inductance becomes smaller. Accordingly, referring to FIG. 12, when the size of the change in inductance sensed by each of the plurality of sensors 120a and 120b is compared, the display apparatus may determine a position of a user's touch. For example, the display apparatus 100 compares the size of the inductance change sensed by the sensor 120a disposed at the position a with the size of the inductance change sensed by the sensor 120b disposed at the position b, and if the size of the inductance change sensed by the disposed sensor 120a is larger, it may be determined that a region near the sensor 120a disposed at the position a is touched. If the size of the change in inductance sensed by the sensor 120b disposed at the position b is larger, it may be determined that an area close to the sensor 120b disposed at the position b is touched.

In the meantime, the display apparatus 100 may determine that a touch is generated at the corresponding position based on a position corresponding to the size of the change of the prestored inductance.

As described above, the display apparatus 100 may compare size of the signal sensed by a plurality of sensors and identify a position where the user touch is performed.

Figure 14:
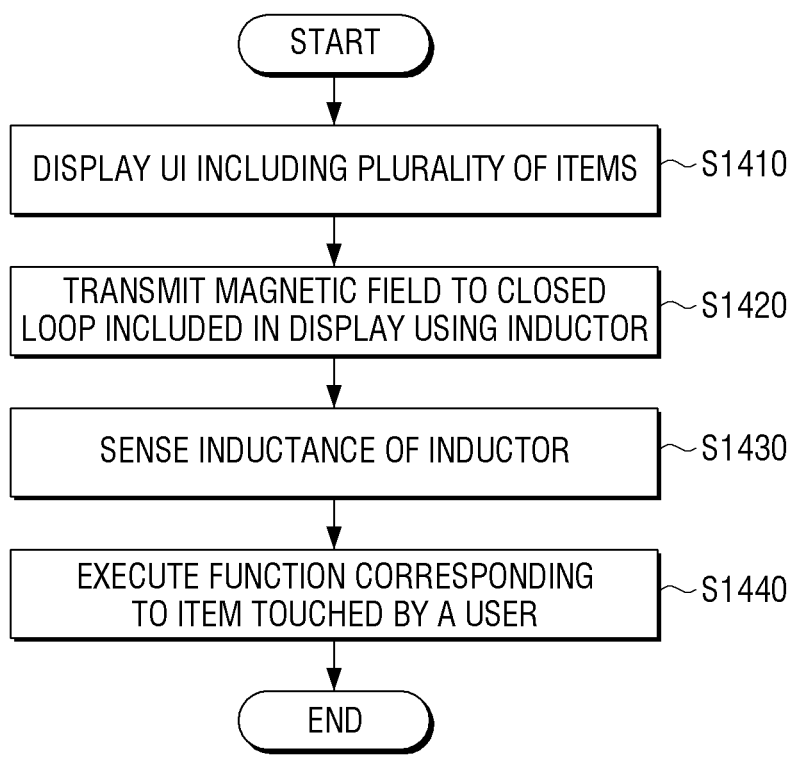
FIG. 14 is a flowchart to describe a controlling method of a display apparatus according to an exemplary embodiment.

FIG. 14 is a flowchart illustrating a method of detecting a user's touch in a display apparatus according to an embodiment of the present disclosure and controlling a display apparatus based on the sensed user's touch.

Referring to FIG. 14, the display apparatus displays a UI including a plurality of items (S1410). Specifically, the display apparatus may display a UI including a plurality of items in a partial area of the display unit displaying an image. Here, the plurality of items may include at least one of a power source, a channel up, a channel down, a volume up, a volume down, an external input, and a menu, but it is not limited thereto, and the number, type, and arrangement type of the items can be implemented more diversely.

Then, the display apparatus may transmit the magnetic field to a closed loop circuit included in a display using an inductor (S1420). Specifically, the display apparatus may include a sensor disposed on a back side of the display, and the sensor may having an inductor which may transmit a magnetic field to an electrode layer of the display, which includes the closed loop circuit. Here, the transmission of the magnetic field may mean that an eddy current is generated in the closed loop circuit of the electrode layer by the magnetic field generated by applying the AC voltage to the inductor of the sensor.

The display apparatus may then sense the inductance in the inductor (S1430). Specifically, by the eddy current generated in the closed loop circuit of the electrode layer, induced electromotive force is generated in the inductor of the sensor, so that the display apparatus may sense the inductance of the inductor of the sensor by sensing a current that changes in the circuit of the sensor.

Then, the display apparatus may perform a function corresponding to the item touched by the user based on the size of the change in sensed inductance (S1440). Specifically, when the closed loop circuit of the electrode layer is moved by the user's touch, and the distance between the inductor of the closed loop circuit and the inductor of the sensor is changed, the magnetic flux of the inductor may be changed and the inductance of the inductor may be changed. According to an exemplary embodiment, the display apparatus may sense a change in inductance, detect whether the touch is a user's touch, and based on the size of the change in inductance, may determine the position of the user's touch. Specifically, the display apparatus may determine which of the plurality of items included in the displayed UI is a user's touch based on the size of the inductance change, and execute a function corresponding to the item determined to be touched by the user.

The display apparatus may detect only a user's touch in a predetermined area of the display. Specifically, the display apparatus may detect only the user's touch in an area that may be detected by the sensor disposed on the back side of the display. The display apparatus may control the size of the area capable of sensing the touch by adjusting the size value of the inductance, which is determined to be the user's touch. For example, if the size of the inductance determined to be the user's touch is set to a large value, the display apparatus may determine only the touch in the narrow area as the user's touch. If the inductance is set to a small value, the touch in a comparatively large range may be determined as the user's touch.

The display apparatus may further include a step of correcting drift of the inductance value generated according to the state of the display apparatus. Specifically, the frequency of the drift of the inductance value is lower than the frequency of the inductance change amount generated by the touch, and the display apparatus may correct the sensed inductance by removing the area in which frequency is less than the predetermined value from among the inductance sensed by using the high-pass filter.

According to the various exemplary embodiments described above, touch detection may be performed only by adding a sensor to an existing LCD cell. Particularly, since the sensor is positioned at the back end of the backlight, a display apparatus without image quality deterioration and less restriction to design such as thicker bezel may be obtained. In addition, there is no limitation to the apparatuses used for the touch, and it is expected that the cost for realizing the touch function may be reduced by arranging the sensors only in necessary areas to sense the user's touch.

Exemplary embodiments that are described in the present disclosure may be embodied by using at least one of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, electrical units for performing other functions. In some cases, the exemplary embodiments can be implemented by the processor 160. According to various exemplary embodiments, procedures and functions described in the disclosure may be implemented with separate software modules. Each of the software modules may perform one or more functions and operations described in the present specification.

Here, a program is stored in a non-transitory recording medium recordable by computer, and read and executed by computer, the exemplary embodiments of the present disclosure may be implemented.

The non-transitory computer-recordable medium is not a medium configured to temporarily store data such as a register, a cache, or a memory but an apparatus-readable medium configured to semi-permanently store data. Specifically, the above-described various applications or programs may be stored in the non-transitory apparatus-readable medium such as a compact disc (CD), a digital versatile disc (DVD), a hard disc, a Blu-ray disc, a universal serial bus (USB), a memory card, or a read only memory (ROM), and provided therein.

The foregoing exemplary embodiments and advantages are merely exemplary and are not to be construed as limiting the inventive concept. The exemplary embodiments may be readily applied to other types of device or apparatus. Also, the description of the exemplary embodiments is intended to be illustrative, and not to limit the scope of the inventive concept, and many alternatives, modifications, and variations will be apparent to those skilled in the art.

What is claimed is:

1. A display apparatus comprising:
   a display;
   an electrode configured to provide power to the display;
   a sensor configured to:
      provide an electromotive force in a closed loop circuit included in the electrode, and
      sense a change in the electromotive force, which is provided in the closed loop circuit; and
   a processor configured to:
      display, on the display, a User Interface (UI) including one or more items,
      identify a touch input touching at least one item, among the one or more items, based on the sensed change in the electromotive force by the sensor, and
      execute a function which corresponds to the at least one item touched by the touch input, based on a size of the change in the electromotive force provided in the closed loop circuit.

2. The display apparatus as claimed in claim 1, wherein the sensor is disposed in a back side of the display.

3. The display apparatus as claimed in claim 1, wherein the display comprises:
   a backlight layer configured to emit light; and
   a liquid crystal display (LCD) layer configured to selectively transmit the light emitted from the backlight layer,
   wherein the sensor is disposed at a back side of the backlight layer.

4. The display apparatus as claimed in claim 1, further comprising:
   a color filter layer on a front side of the display.

5. The display apparatus as claimed in claim 1, wherein the sensor comprises:
   a coil; and
   a power source configured to be serially connected to the coil and supply an alternating current (AC) power, and
   wherein the sensor is configured to identify the touch input based on a change in inductance of the coil corresponding to the sensed change in the electromotive force which is provided in the closed loop circuit.

6. The display apparatus as claimed in claim 5, wherein the sensor is configured to identify which of the one or more items is touched by the touch input based on a size of the change in the inductance.

7. The display apparatus as claimed in claim 1, wherein the one or more items comprise two or more of a power source, a channel up, a channel down, a volume up, a volume down, an external input, and a menu.

8. The display apparatus as claimed in claim 1, further comprising:
   another sensor which is spaced apart from the sensor,
   wherein the processor is configured to identify a position of the touch input by comparing a size of inductance change identified by the sensor and the other sensor respectively.

9. The display apparatus as claimed in claim 1, wherein the sensor identifies only the touch input in a predetermined area of the display.

10. The display apparatus as claimed in claim 1, further comprising:
    a chassis configured to protect the display,
    wherein the sensor is disposed between the chassis and the display.

11. The display apparatus as claimed in claim 1, further comprising:
    a filter configured to remove an area in which frequency is less than a predetermined value from among values of change in the electromotive force sensed by the sensor.

12. The display apparatus as claimed in claim 1, wherein the touch input is a user's touch.

13. A display apparatus comprising:
    a sensor comprising a coil configured to provide a magnetic field in accordance with an alternating current (AC) voltage applied to the coil;
    a display configured to display a User Interface (UI), the display comprising a layer provided with a closed loop circuit configured to provide an electromotive force in response to the magnetic field; and
    a processor configured to identify a location of a touch input based on a change in an intensity level of the electromotive force provided by the closed loop circuit corresponding to a change in distance between the coil and the layer provided with the closed loop circuit.

14. The display apparatus as claimed in claim 13, wherein when the distance between the coil and the layer of the display having the closed loop circuit changes, in response to an external force, the processor is further configured to identify the location of the touch input based on the change in the intensity level of the electromotive force provided by the closed loop circuit corresponding to the change in the distance between the coil and the layer of the display having the closed loop circuit.

15. A controlling method of a display apparatus, the method comprising:
    displaying a User Interface (UI) including one or more items on a display of the display apparatus;
    transmitting a magnetic field to a closed loop circuit, included in an electrode configured to provide power to the display, using an inductor of a sensor, the magnetic field providing an electromotive force in the closed loop circuit;
    sensing a change in inductance of the inductor corresponding to a change in the electromotive force;
    identifying a touch input touching at least one item, among the one or more items, based on the sensed change in the electromotive force by the sensor; and
    executing a function corresponding to the at least one item touched by the touch input, based on a size of the change in the electromotive force provided in the closed loop circuit.

16. The controlling method as claimed in claim 15, wherein the one or more items comprise two or more of a power source, a channel up, a channel down, a volume up, a volume down, an external input, and a menu.

17. The controlling method as claimed in claim 15, wherein the executing comprises identifying which of the one or more items is touched by the touch input based on a size of the change in the inductance, and
    wherein the identifying comprises identifying only the touch input in a predetermined area of the display.

18. The controlling method as claimed in claim 17, wherein the identifying comprises identifying an item touched by the touch input by comparing a size of the inductance change provided in each of a plurality of sensors.

19. The controlling method as claimed in claim 15, further comprising:
- removing an area in which frequency is less than a predetermined value from among the sensed inductance.

20. The controlling method as claimed in claim 15, wherein the touch input is a user's touch.

* * * * *